United States Patent
Azimane

(10) Patent No.: US 7,689,878 B2
(45) Date of Patent: Mar. 30, 2010

(54) SYSTEM AND METHOD FOR TESTING DEFECTS IN AN ELECTRONIC CIRCUIT

(75) Inventor: Mohamed Azimane, Eindhoven (NL)

(73) Assignee: NXP B.V., Eindhoven (NL)

( * ) Notice: Subject to any disclaimer, the term of this patent is extended or adjusted under 35 U.S.C. 154(b) by 718 days.

(21) Appl. No.: 10/557,379

(22) PCT Filed: May 17, 2004

(86) PCT No.: PCT/IB2004/050708

§ 371 (c)(1), (2), (4) Date: Nov. 18, 2005

(87) PCT Pub. No.: WO2004/105045

PCT Pub. Date: Dec. 2, 2004

(65) Prior Publication Data

US 2007/0033453 A1    Feb. 8, 2007

(30) Foreign Application Priority Data

May 22, 2003  (EP)  .................................. 03101470

(51) Int. Cl.
G11C 29/00 (2006.01)
G06F 12/00 (2006.01)

(52) U.S. Cl. .................. 714/718; 365/201; 711/105

(58) Field of Classification Search ................. 714/718, 714/720, 742, 724; 365/201; 711/105
See application file for complete search history.

(56) References Cited

U.S. PATENT DOCUMENTS

| 4,335,459 | A | * | 6/1982 | Miller | 714/755 |
| 4,872,168 | A | * | 10/1989 | Aadsen et al. | 714/720 |
| 5,270,975 | A | * | 12/1993 | McAdams | 365/200 |
| 5,392,247 | A | * | 2/1995 | Fujita | 365/200 |
| 5,751,742 | A | * | 5/1998 | Von Basse et al. | 714/773 |
| 6,079,037 | A | * | 6/2000 | Beffa et al. | 714/720 |
| 6,647,520 | B1 | * | 11/2003 | Fukuda | 714/718 |
| 6,928,594 | B2 | * | 8/2005 | Kouchi et al. | 714/718 |

FOREIGN PATENT DOCUMENTS

EP    0738418 B    10/1996

* cited by examiner

Primary Examiner—James C Kerveros

(57) ABSTRACT

A new test pattern which consists of performing "very small jumps" and "very big jumps" within the matrix. The "very small jumps" are controlled by the row decoder, and have the effect of sensitizing the resistive open defects which lead to slow-to-fall behavior in the word line. A "very small jump" means that the memory position of two consecutive accesses remains in a unique sub-cluster until all rows in that sub-cluster have been tested, remains in the same cluster until all rows in that cluster have been tested, remains in the same U section until all rows in that U section have been tested, and finally, remains in the same Z block until all of the rows of that Z block have been tested. The "very big jumps" are intended to cover the class of resistive open defects which leads to slow-to-rise behavior, and is intended to mean that two consecutive memory accesses must never stay in the same sub-cluster, at the same cluster, or at the same U section.

10 Claims, 9 Drawing Sheets

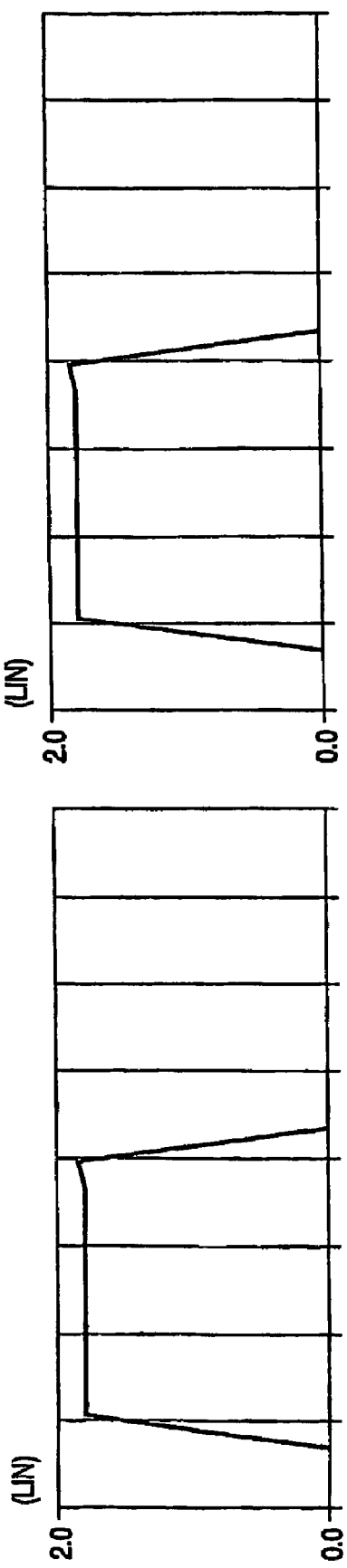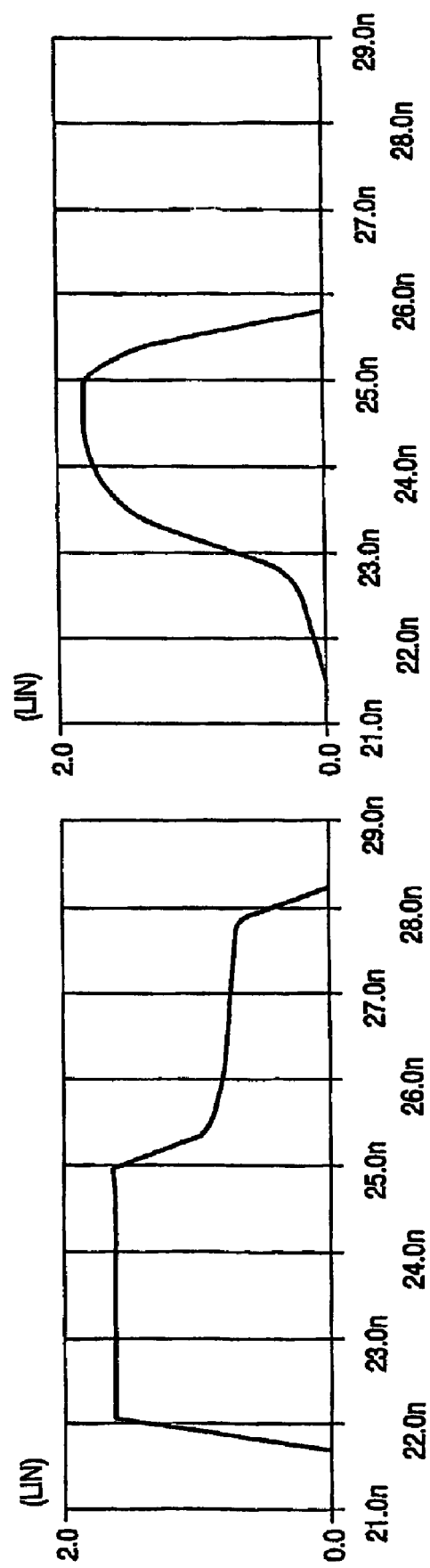
FIG. 5a
Slow-to-fall behaviour
FIG. 5b
Slow-to-rise behaviour

SYSTEM AND METHOD FOR TESTING DEFECTS IN AN ELECTRONIC CIRCUIT

This invention relates to a method and apparatus for testing an integrated circuit, such as a semiconductor memory address decoder or a random logic circuit, and more particularly, to a method and apparatus for testing such circuits for the presence of open defects.

Systematic and automatic testing of electronic circuitry, and of integrated circuits in particular, is becoming increasingly important. Each generation of circuit tends to comprise ever higher component densities and an increasing number of system functionalities. Individual circuits have become complicated to such an extent that process defects cannot be detected and located, except by means of exhaustive and expensive testing. It will be appreciated that customers cannot be expected to accept circuitry products that only reveal their hidden defects during operational use, thereby rendering, for example, life support systems or aircraft control systems unreliable. It is therefore of the utmost importance to both the manufacturer and the customer that tests are performed so as to ensure flawless operation of the circuitry products.

Random access memories (SRAMs, DRAMs) occupy a strategic position in the microelectronics industry. In many respects, RAM testing is different from conventional logic testing. RAMs tend to be the largest and densest circuits produced, and their small feature size and huge chip size result in an enormous critical area for defects. High complexity and defect sensitivity have pushed RAM testing costs to the extreme, and a variety of solutions to this problem have been proposed.

Random access memories are usually subjected to March tests and/or Data Retention tests. In a March test, individual march elements traverse all RAM addresses and perform a specified combination of read and write operations. For example, a typical march element first reads each RAM address location and then writes back the complement of expected data values. Together, all of the march elements should cover all of the likely faults in a given RAM.

After compiling the likely faults into a RAM fault model, a test engineer will develop a test algorithm to cover it The total number of memory operations performed by all march elements for a given RAM address determines a test algorithm's overall complexity. The complexity of march test algorithms is linear with respect to the address space; hence, they are also known as linear algorithms.

Conventionally, it has been suggested that RAM decoder defects can be mapped as RAM array faults and detected by testing the RAM array, such that in the past it has been assumed that circuits such as address decoders need no special testing. However, it has since been discovered that some open defects can occur in circuits such as RAM address decoders which are not detectable by means of march tests.

Open defects, or stuck-open transistor faults, cause sequential behavior in CMOS circuits and require a two-pattern test sequence for their detection. Open defects in RAM matrices appear as cell read failures, row/column read failures, or cell stuck-at (SA) faults, all of which are detectable by march tests. However, march tests fail to detect one class of open defects in circuits such as address decoders.

A brief description of the hierarchical design of an RUT (ROM Under Test) will now be given.

A typical example of a ROM might have 256 rows of memory cells, 8 columns of memory cells, 32 Z blocks (256/8) and 16 bits per word may be used for analogue fault simulation. An RUT in accordance with an exemplary embodiment of the prior art contains three decoders, X, Y and Z. The X decoder selects rows of memory cells, the Y decoder selects columns of memory cells, and the Z decoder selects the Z blocks. However, the X decoder contributes to the selection of columns because each Z block is divided into U sections, and each U section may contain up to 64 rows and is restricted to a local bit line (LBL). In order to have access to a row, it is first necessary to access the corresponding U section which contains that row.

An X decoder selects the rows within the matrix, divides the Z blocks into different U sections and contributes to select the columns (as will be explained later). The X decoder consists of four blocks, which are:

The X predecoder;
The X postdecoder;
The internal X decoder; and
The even/odd X decoder The X predecoder and the X postdecoder are shared by all Z blocks, while the internal and even/odd X decoders belong to a unique Z block of the ROM.

The matrix of each Z block is divided into U sections which contain no more than 64 rows. Each U section consists of clusters, each cluster consists of two subclusters, and finally each subcluster consists of two rows. FIG. 1 is a schematic representation of the hierarchical design of one Z block with 256 rows, and illustrates the data path followed by the X decoder to select the rows. Each row belongs to a unique subcluster which belongs to a unique cluster. A cluster belongs to a unique U section, which belongs to a unique Z block of the ROM.

The internal X decoder is located within the memory matrix, while the even/odd X decoder is external. The predecoder consists of a combinational circuit which selects two parallel parts of the postdecoder; the first part consists of the U driver and relates to the selection of the U section, while the second part consists of the X driver and relates to the selection of a cluster. The subcluster is selected with the least significant bit of the predecoder. Finally, the even/odd X decoder selects the row.

FIG. 2 illustrates the distribution of the X address bits to access the different blocks of a Z block. The X address bits are divided into four groups. The first group (defined by the U driver) consists of the most significant bits (NSBs) and relates to the selection of the U sections, the second group (defined by the X driver) consists of the remainder of the address bits (medium bits), except the two least significant bits, and relates to the selection of a cluster, the third group (defined by the precoder) consists of the second least significant bit (LSB1) and selects the subcluster, and the fourth group (defined by the even/odd X decoder) consists of the least significant bit (LSB0) and selects the row.

Because of the hierarchical design, selection of columns of memory cells can only be performed by the Y decoder when the X decoder has selected the corresponding U section. In other words, only the columns which belong to the selected U section can be selected by the Y decoder, as will be explained in more detail as follows, such that the final selection of columns is effectively a combination of the X and Y decoder operation, and the Y addresses do not have complete control over column access.

The Y decoder is divided into three blocks, namely the Y predecoder, the even/odd Y decoder and the internal Y decoder. The Y predecoder is a combinational circuit which selects a global bit line (GBL) to be read (see below). The even/odd Y decoder selects the GBL that will be loaded during a read cycle and also preselects the local bit line (LBL) that will be accessed. The internal Y decoder gets the information from the X postdecoder (U driver) and the even/odd Y decoder to select the even/odd LBL to be accessed. Actually, the internal Y decoder makes two selections with one signal, the first consists of the selection of the U section to be accessed (dependent on the X decoder), while the second consists of selection of the LBL. The preselection of the columns is thus partially performed by the X decoder because of the division of the Z blocks into U sections.

In more detail, a typical RUT matrix consists of six blocks:
The global bit lines (GBL);
The local bit lines (LBL);
The word lines (WL);
The memory cells;
The internal combinational circuit; and
The sense amplifiers Each GBL is connected to two LBLs per U section and one sense amplifier. The cell may consist of one NMOS transistor which is connected to the LBL when the stored logic value is 0, and is not connected to the LBL when the stored logic value is 1. The GBL is charged to 1 every read cycle, and is discharged by the local bit line when the read logic value is 0. The same GBL cannot be discharged by the same LBL if, in another row, the cell transistor is not connected to the LBL, even when it is activated. Thus, the read logic value in this case would be 1. The internal combinational logic is divided into two different blocks, one for selecting the LBL and the other for selecting the WL. The sense amplifier which enables the content of a respective GBL to be read is selected by the internal Y decoder of the Z block.

FIG. 3 schematically illustrates an exemplary matrix design of an RUT with the connection between the GBL, the LBL, the sense amplifiers and the select lines. The GBL is connected to two LBLs which can be selected by the ysel and ybsel select lines of the internal Y decoder, while the even/odd GBLs are loaded when they are selected by the pche/pcho select lines of the Y predecoder. The ysel and ybsel select lines enable the GBL contents to be read through the sense amplifiers. It will be appreciated that FIG. 3 schematically illustrates the main block of an exemplary matrix design, to assist in the understanding of matrix selection through the X and Y decoders.

The Z decoder selects the Z block that will be accessed. The Z signals are divided into three groups: the first group enables the even/odd and the internal X decoder, the second group enables the internal Y decoder, and the third group enables the multiplexers which connect the sense amplifiers of the Z blocks to the bus. In fact, the Z decoder enables only one U section of the accessed Z block and not the complete Z block, thereby enabling power consumption of the chip to be reduced. The remaining U sections of the selected Z block remain disabled.

As explained above, conventionally, it has been suggested that RAM decoder defects can be mapped as RAM array faults and detected by testing the RAM array, such that in the past it has been assumed that circuits such as address decoders need no special testing. However, it has since been discovered that some open defects can occur in circuits such as RAM address decoders which are not detectable by conventional march tests.

Open defects, or stuck-open transistor faults, cause sequential behavior in CMOS circuits and require a two-pattern test sequence for their detection. Open defects in RAM matrices appear as cell read failures, row/column read failures, or cell stuck-at (SA) faults, all of which are detectable by march tests. However, march tests fail to detect one class of open defects in circuits such as address decoders.

Referring to FIG. 4 of the drawings, open defects can be classified into two classes, as follows:

Inter-gate defects, which occur between different gates of an address decoder and tend to cause stuck-at or logical delay behavior; the stuck-at behavior can normally be detected by the conventional march tests; however, logical delay behavior cannot.

Intra-gate defects, which occur within the different gates of an address decoder and tend to cause sequential or sequential delay behavior; these types of defects are not completely covered by traditional march tests, and hence require special multiple test pattern sequences.

A method of testing a memory address decoder is disclosed in European Patent Number EP-B-0738418. The method disclosed in this document involves writing complementary logic data to two respective cells of two logically adjacent rows or columns. If a subsequent Read operation reveals the data in the two cells to be identical, the presence and location of hard-open defects in the decoders is demonstrated. In more detail, the method disclosed in EP-B-0738418 uses a systematic approach in which a first logic state is written to the first cell and then a second logic state, complementary to the first, is written to the second cell. Reading the first cell after completion of the write operation of the Write operation conducted on the second cell should reveal that the first cell is still in the first logic state if the decoding means is functioning correctly. However, if the first cell turns out to have assumed the second logic state, then the first cell was overwritten during the Write operation of the second cell, thereby enabling the detection and location of a defect in the decoding means.

The test method described in EP-B-0738418 can be used to detect resistive open defects which lead to sequential behavior. However, the class of resistive open defect which leads to sequential delay behavior is not covered, as will be explained in more detail below.

Thus, the march tests do not cover the intra-gate resistive open defects because this family of algorithms is based on generating the addresses in an increasing and decreasing address order. Also, it is impossible to cover exhaustively such open defects by linear algorithms. The intra-gate open defects require the use of special test pattern sequences which have to be added to the march tests to increase the open defect coverage. Moreover, resistive open defects which lead to logical and sequential delay behavior remain completely uncovered.

Referring to FIGS. 5a and 5b, logical and sequential delay behavior can be categorized by "slow-to-fall" behavior (FIG. 5a), in which the logic state of the cell gradually falls from its maximum over time, and "slow-to-rise" behavior (FIG. 5b), in which the maximum logic state is gradually reached over time.

These types of defect lead to significant customer returns and reliability problems. Accordingly, we have devised an improved arrangement.

In accordance with a first aspect of the present invention, there is provided a method for testing an electronic circuit that comprises a matrix of cells for receiving logic data, said matrix of cells being divided into a plurality of Z blocks each comprising n rows of cells, where n is an integer >1, the method comprising the step of accessing each of said cells in said matrix, and being characterized in that two consecutive cell accesses remain in the same Z block until all n rows therein have been accessed.

The term "access" used herein means a read and/or write operation. For read-only-memories (ROM), only a read operation is used for both sensitization and detection. For random access memories (RAM), both read and write can be used to sensitize and to detect defects. In the case of write operations, the Data backgrounds are preferably taken into account to observe the defect behavior. The data background of the sensitization access and the detection access should be complemented to see either the AND/OR logic of two memory words (in the case of slow-to-fall) or the binary vector 111 . . . 1 and 000 . . . 0 (in the case of slow-to-rise).

In a preferred embodiment, each Z block is divided into a plurality of U sections, each comprising some of the n rows of the respective Z block, and the method is characterized in that two successive cell accesses remain in the same U section until all rows therein have been accessed. More preferably, each U section is divided into a plurality of clusters, each comprising some of the rows of the respective U section, and the method is characterized in that two successive cell accesses remain in the same cluster until all rows therein have been accessed. Still more preferably, each cluster is divided into a plurality of sub-clusters, each comprising some, preferably two, of the rows of the respective cluster, and the method is characterized in that two successive cell accesses remain in the same sub-cluster until all rows therein have been accessed.

Thus, in accordance with a first aspect of the invention, a new test pattern is proposed which consists of performing "very small jumps" within the matrix. These jumps are preferably controlled by the row decoder, and have the effect of sensitizing the resistive open defects which lead to slow-to-fall behavior at the word line. A "very small jump" in the context of a preferred embodiment of the present invention is intended to mean that the memory position of two consecutive accesses remains in a unique subcluster until all rows in that subcluster have been tested, remains in the same cluster until all rows in that cluster have been tested, remains in the same U section until all rows in that U section have been tested, and finally, remains in the same Z block until all of the rows of that Z block have been tested. The same procedure is then applied to all other Z blocks of the memory.

In a preferred embodiment, said cell accesses or read and/or write operations are performed in respect of each row of cells in said selected block in increasing address order and then in decreasing order, or vice versa.

Preferably, the blocks are selected in increasing and/or decreasing address order.

It will be appreciated that, when the address generator of a test algorithm verifies the "very small jump" condition, the slow-to-fall faults are sensitized and the corresponding resistive open defects become detectable. For the family of march tests, the "very small jumps" are verified when the logical addresses are increased and decreased without scrambling, which enables the detection of the part of a resistive open defect which leads to slow-to-fall behavior. The "very small jump" test condition can be adapted to the tree design decoder described above depending on the accessibility control of the matrix (see FIG. 2). When a test algorithm verifies the "very small jump" condition in both increasing and decreasing address order, two memory rows are simultaneously enabled, and the read operation gives the AND or OR logic of the accessed memory words, which can then be detected.

In accordance with a second aspect of the present invention, there is provided a method for testing an electronic circuit that comprises a matrix of cells for receiving logic data, said matrix of cells being divided into a plurality of Z blocks each comprising n rows of cells, where n is an integer >1, each of said Z blocks being divided into a plurality of U sections, each comprising some of the n rows of the respective Z block, the method comprising the step of accessing each of said cells in said matrix, and being characterized in that two successive cell accesses are caused to be performed in different U sections within the same Z block.

Preferably, each block of said Z blocks is selected in increasing and/or decreasing order.

In a preferred embodiment, each U section is divided into a plurality of clusters, each comprising some of the rows of cells of the respective U section. More preferably, each cluster is preferably divided into a plurality of sub-clusters, each comprising some, preferably two, of the rows of the respective cluster.

The method may comprise a sequence of consecutive cycles, as follows:
a) selecting a first Z block;
b) accessing each of said rows of cells in said selected Z block in the following logical address order:
  i) the first row;
  ii) the last row;
  iii) the row having a logical address equivalent to said first row plus 1;
  iv) the row having a logical address equivalent to said last row minus 1;
c) repeating steps i) to iv) until all rows in the selected Z block have been accessed; and then
d) selecting a second Z block;

until all Z blocks have been selected.

Thus, the second aspect of the present invention consists of performing "very big jumps" within the matrix to cover the class of resistive open defect which leads to slow-to-rise behavior. This class of resistive open defect is sensitized when "very big jumps" between the sub-blocks of the matrix are performed. In accordance with the second aspect of the present invention, a "very big jump" within a memory means that two consecutive memory accesses must never stay in the same sub-cluster, at the same cluster, or at the same U section (see FIG. 7 of the drawings). However, the sensitizing access should stay in the same Z block as the detection access, otherwise a masking problem occurs. This is because jumping between different Z block masks the fault effect of the row and column decoder, and the local resistive open defects of the Z block remains undetected. When a test algorithm verifies the "very big jump" condition the memory row is unselected, and the memory output gives the wrong logic value 0 or 1 depending on the memory design, which are relatively easily detected.

It will be appreciated that, still further in accordance with the present invention, there is provided a method of testing an electronic circuit, which combines the characterizing portions of the methods of both the first and second aspects of the invention.

It will be further appreciated that the present invention extends to apparatus for carrying out any of the above-defined methods.

These and other aspects of the present invention will be apparent from, and elucidated with reference to, the embodiments described hereinafter.

Embodiments of the present invention will now be described by way of example only and with reference to the accompanying drawings, in which:

FIG. 5a is a graphical illustration of the correct behavior (top) and slow-to-fall behavior (bottom) which may be displayed by a memory cell;

FIG. 5b is a graphical illustration of the correct behavior (top) and slow-to-rise behavior (bottom) which may be displayed by a memory cell;

FIG. 7 shows a representation of the jumps needed to cover the resistive open defect leading to slow-to-rise open defect. Both the first and last address in this Figure means the first and the last memory position of one Z block.

Figure 1:
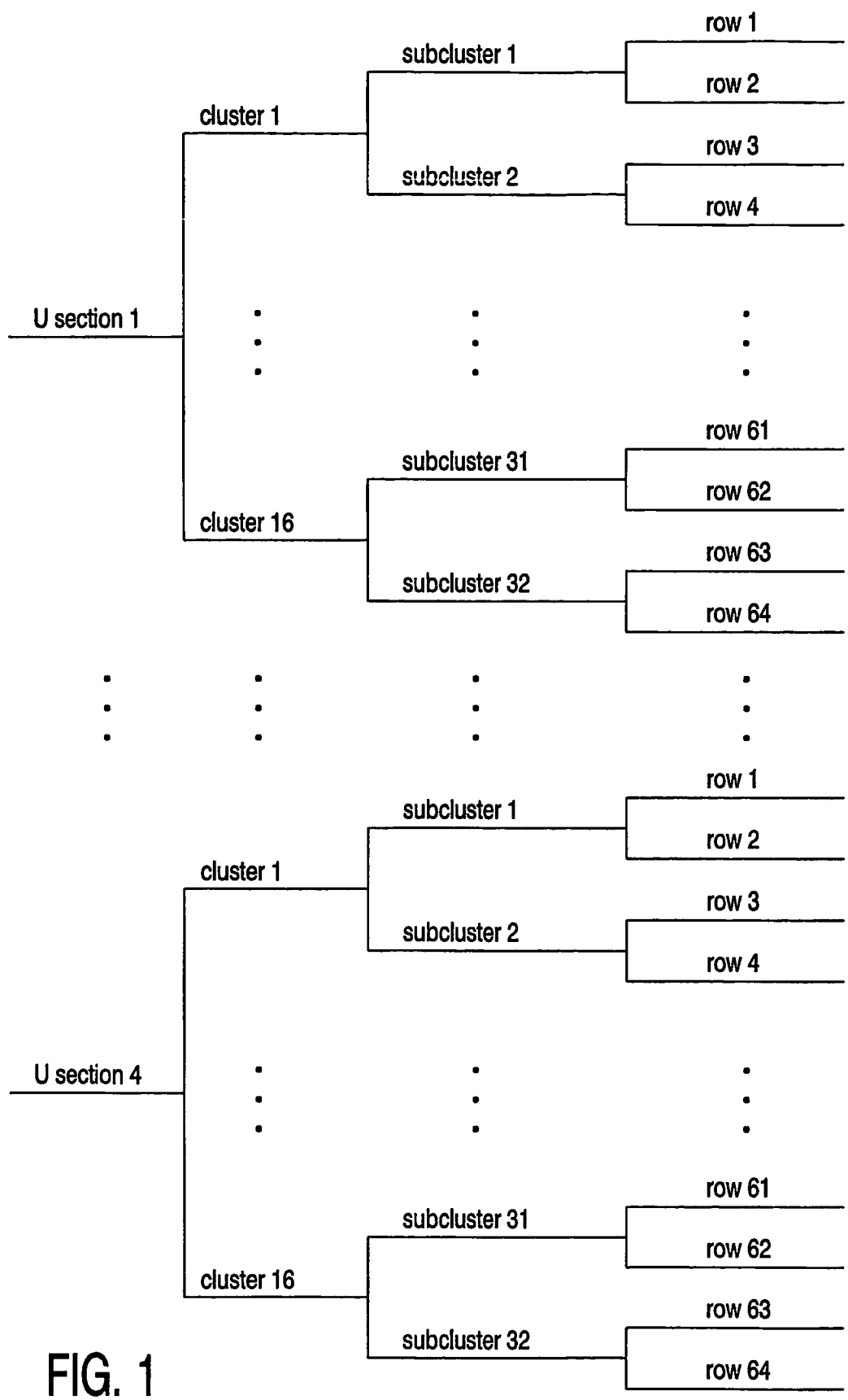
FIG. 1 is a schematic diagram illustrating the hierarchical design of a Z block, in the case of 256 rows.
Figure 2:
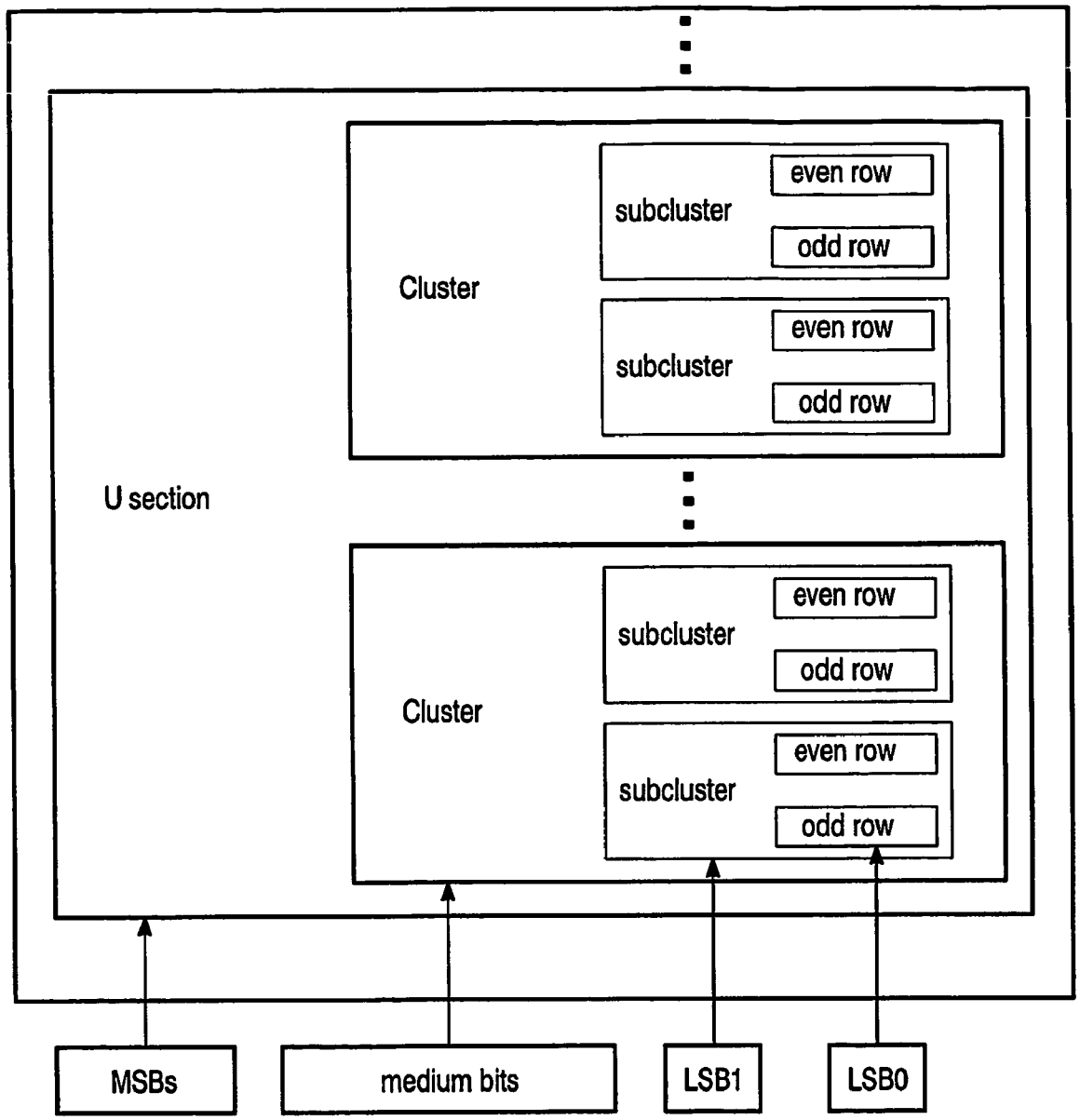
FIG. 2 is a schematic diagram illustrating the accessibility control of the matrix by the X address bits.
Figure 3:
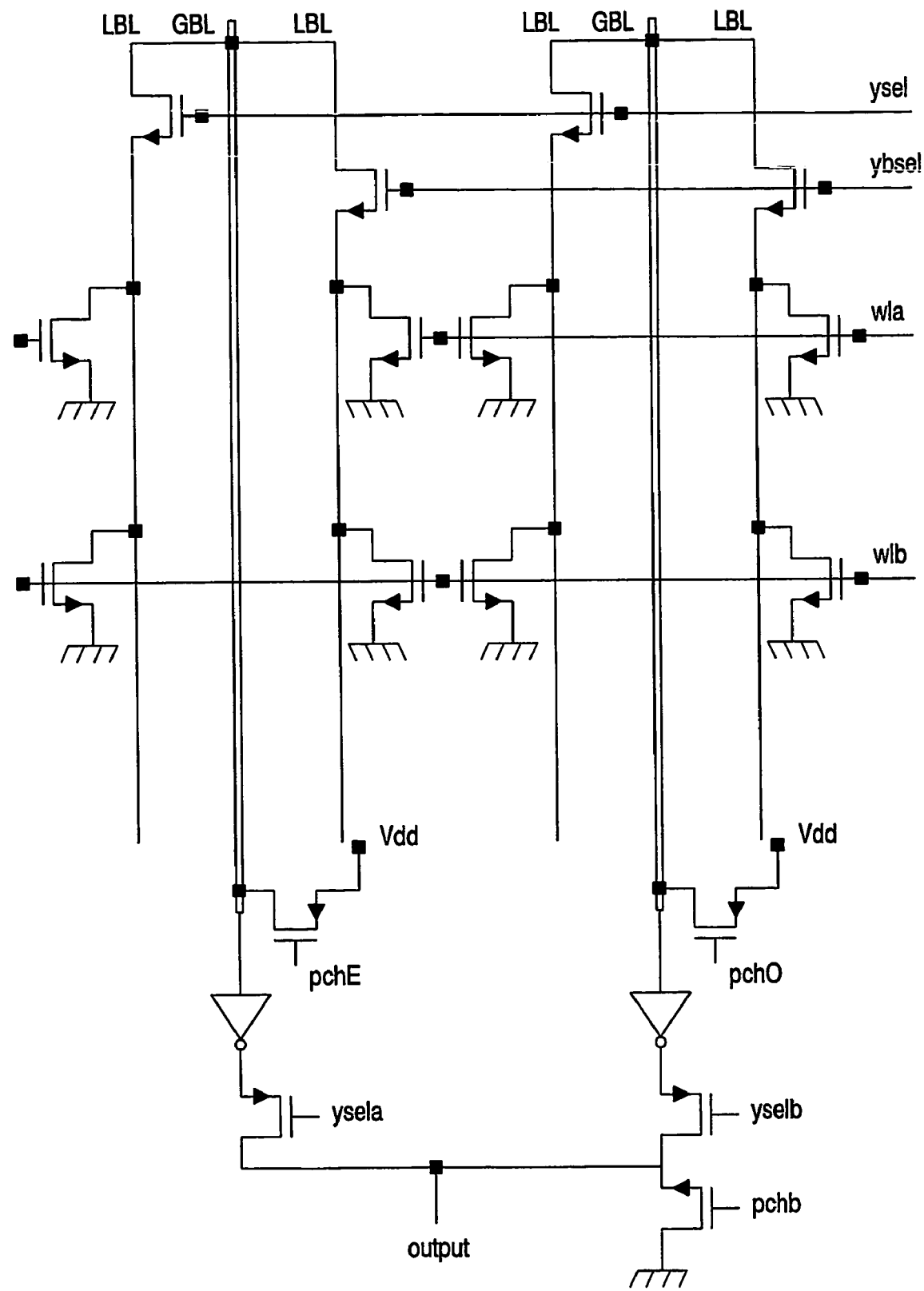
FIG. 3 is a circuit diagram illustrating a matrix design with the corresponding select lines.
Figure 4:
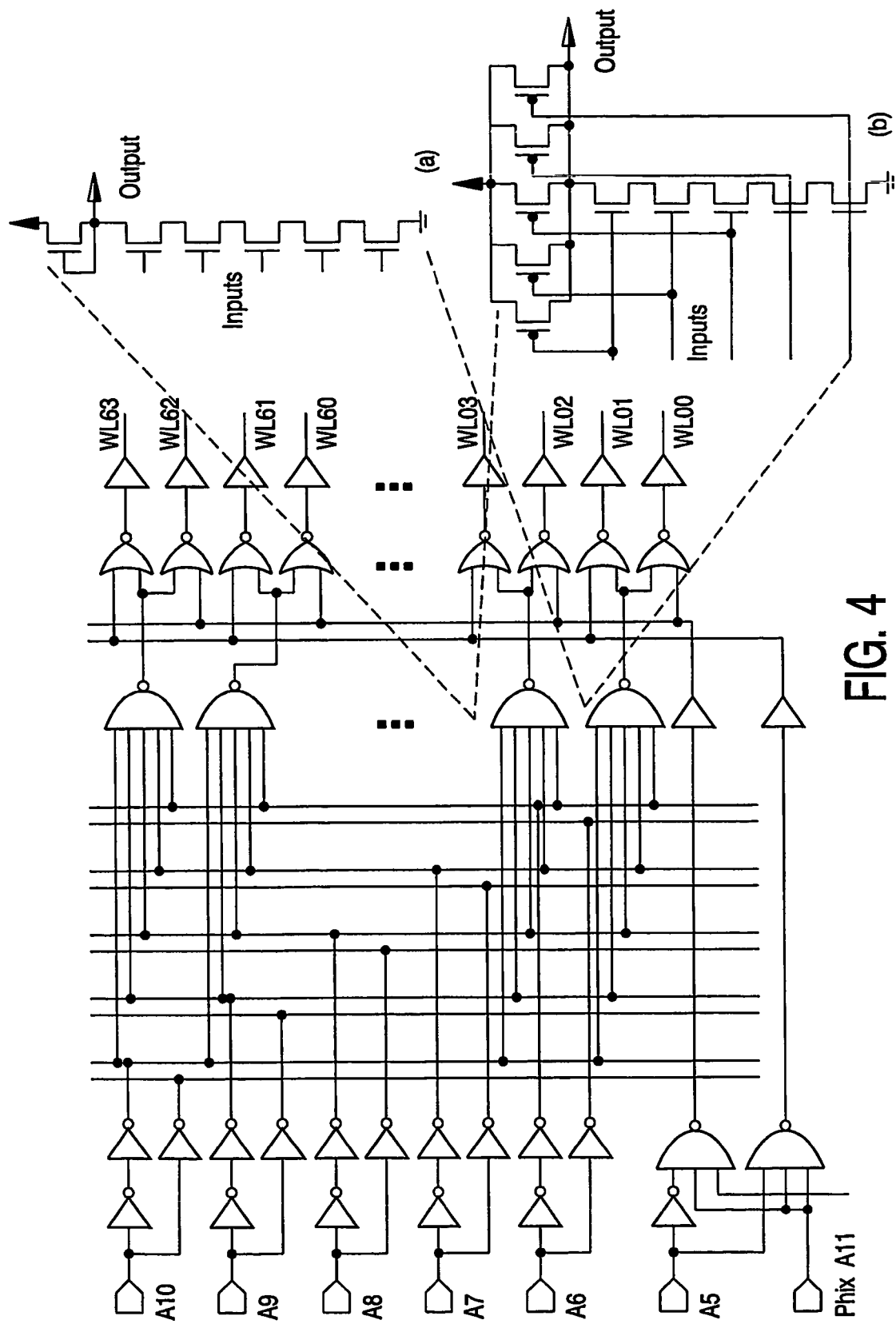
FIG. 4 is a schematic circuit diagram of a conventional address decoder illustrating inter-gate and intra-gate open defects.

As already explained, there is a difference between the following operations:

The subblocks are already enabled and to have an access to its row.

Enable simultaneously the subblocks and have an access to its row.

In accordance with an exemplary embodiment of the invention, to detect the class of resistive open defect leading to slow-to-fall, the subblocks of the matrix must already be enabled, and then the method comprises the step of enabling only the nearest row to the previous access, such that the "very small jump" condition is verified. This means that the subblocks: Z block U section, cluster, and the subclusters are already enabled during the sensitizing operation by accessing one of the rows (even/odd), and jumping only to the next row (odd/even) that belong to the same subblocks as the first access to detect the open defect.

To detect the class of resistive open defect leading to slow-to-rise, both the subblocks of the matrix and the memory row must be simultaneously enabled. This means that the subblocks of the matrix of the Z block must not be enabled during the sensitizing operation. During each memory access new subblocks must be enabled.

X Decoder Test

The injected X decoder delay faults: slow to fall and slow to rise show two different faulty behavior of the memory. The slow to fall fault models affect the result of the read operation which behaves like the AND of two words, however the slow to rise fault avoids the GBL discharge and the read results give 1 because the load operation is performed each read cycle.

In the case of the X decoder the injected delay fault affects the complete word, which makes it easy to detect the faulty access. However, for ROMs, the AND logic of two words may give also the correct answer when the consecutive accessed word contains more zeros than the wrong word or contains partially the same binary data, which may mask the delay fault.

The design of the RUT have been studied which allows to know the X decoder location. The external part of the X decoder is shared by all the Z blocks while the even/odd and the internal X decoder belong to a unique Z block. In order to cover all delay faults the same test algorithm must be applied for all Z blocks. The location of the X decoder blocks makes the test algorithm bidimensional. During the test of the internal X decoder of one Z block the Z address must be maintained constant. However, the same test must be applied to the remaining Z blocks to cover the internal delay faults of the X decoder.

Slow to Fall

Slow to fall faults in the X decoder can be explained as follows:

The faulty memory row remains still selected after the read cycle, which means that the consecutive read operation may be affected by the previous one.

The Simulation of the Pstar model of the RUT shows that the faulty behavior of the memory is the AND logic of the correct and the faulty memory words.

Conditions to detect the slow to fall faults are:

1. The AND logic operation should verify the condition: $AND(D_i, D_{i+1}) \neq D_{i+1}$, where $D_i$ and $D_{i+1}$ are the contents of the faulty and the correct memory words, respectively, which are read consecutively.

2. Because the memory may contain more that one Z block, and because each Z block contains its own internal X decoder and a second small external part of the X and Y decoder, is necessary to apply the same test sequences to the remainder Z blocks to cover the internal delay faults. The X decoder test must be applied to every Z block. When the X decoder test is finished for the first Z block the same test must be applied for the remainders. At the same time, the Z address must be maintained constant during the test of the internal X decoder of one Z block, otherwise the slow to fall fault models are masked.

3. To perform "a very small jump" within the matrix, there are controlled by the X decoder and are necessary to sensitize the slow to fall faults, otherwise there are not detected because of the hierarchical design. The Z block is divided into U sections which can contain no more than 64 rows, and are controlled by the U drivers which are controlled by the most significant bits of the X decoder. The U section is divided into a cluster of four rows. Each cluster is divided into two subclusters of two rows. A very small jump within the memory means to stay in a unique subcluster until both rows are tested, to stay in one cluster until the four rows are tested, to stay in one U section until the 64 rows are tested, and finally to stay in the same Z block until all rows are tested. If this condition is not respected the sensitizing operation of the slow to fall faults is not well performed and these faults remain undetectable.

4. For ROMs, two bits are added to each row because a slow to fall fault can produce the correct answer. These two bits contain a specific data that allows to detect the AND logic behavior. This addition avoids the fault masking because of the ROM content. If the added bits of a two consecutive row contains respectively the data 01 and 10 the AND logic values of the faulty and the correct words that belong also to the consecutive rows produces 00 in the added bits which guarantee the detection of the slow to fall faults.

Conclusion:

For every Z block, the internal and the external decoders must be tested. The slow to fall faults are completely covered if the conditions 1, 2, 3 and 4 are respected.

Because of power consumption an inversion of the read logic value is performed, which means that the read values may be different than the stored values.

The condition 1 is related with the real content of the memory, i.e. the real content of the cells, and not the read logic values.

Solutions for the slow to fall faults:

The accessed positions should stay in the same Z block, in the same U section, in the same cluster, in the same subcluster until both rows are read. The process must be applied to the next subcluster of the same cluster until the four rows are read. Consecutively, the following read operations must be applied to the next cluster until the first U section is finished. The remainder of the process is applied with the same manner to the following U sections until all of them are read. These operations coincide with the idea of the increasing/decreasing address order of the X decoder for each Z block. The most significant bits are maintained at the same values as the previous address during a sufficient time while the rapid changes are performed on the least significant bits. When the most significant bits are maintained at the same value the read operations are performed on the same U section. When the medium bits, that are in between the most significant bits and the least significant bits, are maintained at the same values as the previous address the read operations are performed on the same cluster of four rows. When the bits of the complete address are maintained at the same values as the previous address while the least significant two bits are changed, the consecutive read operations are performed on the same subcluster, and on the same cluster. Thus, the read operations of the two rows that belong to the same subcluster are performed consecutively, and also the read operation of the four rows that belong to the same cluster are performed consecutively, and finally the read operations of the rows that belong to the same U section are read consecutively in increasing/decreasing address order.

The sensitizing operation of the slow to fall faults consists on to stay in the same set of rows and to read the neighbor, which means to make "a very small jump".

Example of Test Pattern for X Decoder for one Z block.

For ROM of 256 rows, a six Xbits are needed. The ROM is divided into four U section which needs two U drivers to be decoded. The most significant bit of the X decoder is sufficient to decode the four U sections.

| First U Section | | | |
|---|---|---|---|
| $\frac{000000}{000001}$ | The most significant bits stay at the same value, the two rows that belong to the same subcluster are read consecutively. | $\frac{\text{First Row}}{\text{Second Row}}$ | First subcluster of the first cluster. |
| $\frac{000010}{000011}$ | The second least significant bit changes to 1 from the previous addresses, which means the second subcluster of the same cluster is enabled. | $\frac{\text{First Row}}{\text{Second Row}}$ | Second subcluster of the first cluster. |
| $\frac{000100}{000101}$ | The most significant bits stay at the same value, the two rows that belong to the first subcluster of the second cluster are read consecutively. | $\frac{\text{First Row}}{\text{Second Row}}$ | First subcluster of the second cluster |
| $\frac{000110}{000111}$ | The second least significant bit changes to 1 from the previous addresses, which means the second subcluster of the same cluster is enabled. | $\frac{\text{First Row}}{\text{Second Row}}$ | Second subcluster of the second cluster. |

| Second U Section | | | |
|---|---|---|---|
| $\frac{100000}{100001}$ | Both rows that belong to the same subclusters are read consecutively, these rows belong to the second U section. | $\frac{\text{First Row}}{\text{Second Row}}$ | First subcluster of the first cluster |
| $\frac{100010}{100011}$ | The second least significant bit changes to 1 from the previous addresses, which means the second subcluster of the same cluster that is read. | $\frac{\text{First Row}}{\text{Second Row}}$ | Second subcluster of the first cluster. |
| $\frac{100100}{100101}$ | The most significant bits stay at the same value, the two rows that belong to the second cluster are read consecutively. | $\frac{\text{First Row}}{\text{Second Row}}$ | First subcluster of the second cluster. |
| $\frac{100110}{100111}$ | The second least significant bit changes to 1 from the previous addresses, which means the second subcluster of the same cluster that is read. | $\frac{\text{First Row}}{\text{Second Row}}$ | Second subcluster of the first cluster. |

The decreasing address order follows also the same system and allows to complete range of the slow to fall faults. During the increasing address order the first row of the one determined subcluster is assumed to be the possible faulty row which are sensitized by the first read operation of the subcluster and is detected during the read operation of the second row of the same subcluster. When the read operation is applied in decreasing address order the second row is sensitized during the first read operation and is detected during the second read of the same subcluster. Thus, the complete range of the slow to fall fault is covered.

Slow to Rise Faults

Slow to rise fault in the X decoder can be defined as follows:

The memory row remains unselected during the read cycle when the correct X address is applied.

The analogue simulation of the ROM shows that the read result of the faulty memory word is the binary vector ONE.

Conditions to detect the slow to rise faults are:

The slow to rise fault can be sensitized if "a very big jump" between a block is performed. Which means: to jump between the U sections of the Z block, between the clusters of the U section, and finally between both subclusters of the cluster. A simple view of this delay problem leads to the idea that it is easy to detect this kind of delay fault, however if the sensitizing condition is not respected the read operation may produce the correct content and the slow to rise faults remain undetectable.

There is a difference between the following operations:
The block is already enabled and to have an access to its row.
To enable simultaneously the block and to have an access to its row.

The first operation does not sensitize correctly the slow to rise fault because the block that contains the row is already enabled, the fault may remain undetectable. The second operation is the correct way to sensitize the slow to rise fault because during the read access the block that contains the row is also enabled. This allows to test at the same time either the block and the row can be simultaneously accessed. There exists different block levels because of the hierarchical design of the ROM. The slow to rise fault can be detected if all block levels are enabled at the same time with the accessed row. Within a determined Z block the U sections, the clusters, the subclusters and the rows must be tested, which leads to different levels of slow to rise faults. The fault coverage reaches the maximum because of the internal delay fault taken into account which may not appear if the problem is reduced to the row levels.

CONCLUSION:

Slow to rise problems must be taken into account within and between U sections, within and between the clusters, within and between subclusters, and finally between rows.

Final Conclusion for X Decoder Test:

To detect slow to fall faults the memory rows of each Z block must be read in increasing and decreasing address order. For X decoder test only one word per row that should be read because Y decoder inputs can be maintained at constant value. The algorithm consists of reading the complete rows of one Z block in increasing address order, after that in decreasing address order. For slow to rise fault "a very big jump" is necessary to detect the faulty blocks of the hierarchical design and the faulty rows, which coincides with the idea of jumping between the first and the last row until all rows are read.

---

Slow to fall faults
For each Z block do
   begin
     Keep Y decoder to constant value;
     Read all rows in increasing address order:
     Read all rows in decreasing address order;
   end
slow to rise faults:
For each Z block do
   begin
     Keep Y decoder to constant value;
     Read the first row:
     Read the last row;
     First = first + 1;
     Last = last − 1;
     Repeat the process until all rows are read;
   end;

---

Y Decoder Test

The Y decoder delay faults are divided into two parts; the slow to rise and the slow to fall faults. Each part has two different fault effects: the word level and the bit level effect. For Y decoder the slow to rise faults are easy to be detected and need only one pattern per fault. The slow to fall fault involves more than one position because of the interaction between the data of the faulty and the correct position. The AND or OR faulty behavior of two positions may produce the correct answer and the fault can be masked. When the slow to fall fault affects only one bit of the word the probability to get the good answer is 75%, which highly reduces the fault coverage.

To detect the slow to rise fault of the GBL and LBL an algorithm based on "a very big jump" operation is applied, which idea consists of selecting during each a read cycle a new GBL with a new LBL. When a new GBL is selected the load operation is tested while the new selection of the LBL allows to test its access. A slow to rise fault of the GBL and the LBL are detected when the wrong read value is always 0 to 1, respectively. All slow to rise faults are detected because all combinations are performed.

To detect a slow to fall fault of the LBL an algorithm based on "a very small jump" operation is applied. The idea of small jumps consists of selecting one GBL per U section and to remain on it until both LBLs are read. The content of the cell must be taken into account to avoid the fault masking. The AND logic value that may be produced because of the faulty LBL gives 75% the correct answer.

The number of patterns needed to detect the X decoder delay faults are higher than that of the Y and Z decoder. If the test algorithm of the Y decoder is merged with the X decoder test the fault coverage of the Y decoder is increased, and the fault masking is resolved. The Y decoder test is repeated for different rows which allows to cover the OR and the AND faulty behavior. The idea of "a very small jump" with respect to the X decoder test is merged with that of the Y decoder test, while "a very big jump" idea of the X decoder test is merged with that of the Y decoder test.

The faulty Y decoder affects the memory behavior at the bit level which may decrease the fault coverage, however because of the merging the fault coverage is again increased and the fault masking is resolved.

A second test method can be applied to cover completely the slow to fall fault of the Y decoder at the bit level with less patterns. This method consists on taking into account the content of the cells to avoid the masking problems.

AND faulty behavior of the LBL of the same GBL

For each GBL per U section do
   Read ($C_1$, 0), where $C_1 \in LBL_1$
   Read ($C_2$, 1), where $C_2 \in LBL_2$ Comment: the AND logic gives 0, the slow to fall fault of the $LBL_1$ is detected.
   Read ($C_3$, 0), where $C_3 \in LBL_2$
   Read ($C_4$, 1), where $C_4 \in LBL_1$ Comment: the AND logic gives 0, the slow to fall fault of the $LBL_2$ is detected.
   End OR faulty behavior of the GBL.

For each couple of the GBL that represent the same bit do
   Read ($C_1$, 1), where $C_1 \in GBL_1$
   Read ($C_1$, 0), where $C_2 \in GBL_2$ Comment: The OR logic gives 1 which can be detected as the incorrect value.
   Read ($C_3$, 1), where $C_3 \in GBL_2$
   Read ($C_4$, 0), where $C_4 \in GBL_1$ Comment: Both GBL represents the same bits, no interaction is observed between the GBLs that represent different bits.
   End The Y decoder test algorithm must be three dimensional because of the internal Y decoder location. Each Z block contains its own internal Y decoders, moreover, the X decoder selects the U section which contains the GBLs and LBLs that are controlled by the Y decoder.

All the internal Y decoders must be taken into account in the Y decoder test, these are located in the Z blocks and the U sections. In order to cover the delay faults of the internal Y decoder, the X and Z addresses are assumed to be the parameters that allows to apply the Y decoder test to the internal Y decoders.

If the conditions explained above are respected and the internal Y decoders are taken into account during the Y decoder test the fault coverage is increased.

Z Decoder Test

The Z decoder test is relatively easy with respect to the other decoders. The slow to rise fault is easily detected during the first read operation of the Z block. Actually, the Z decoder enables the U section and not the complete Z block. Thus the slow to rise fault must be tested at the level of the U section and not at that of the Z block. However, the slow to rise fault related to the U section are already tested during the X decoder test. The slow to rise fault at the Z block level is not yet performed. This allows to avoid the redundant test patterns.

The second part of the test which is related to the slow to fall faults affects the memory content at the bit level. The multiplexers that connect the sense amplifiers to the bus are controlled by the Z decoder. A slow to fall fault at the level of the Z decoder or the multiplexers behave like the OR logic value of two bits. The correct answer may be produced and the delay fault can be easily masked.

Because of the masking problem the memory content must be taken into account during the Z decoder test. The fault effect is observed at the bit level which decreases the faults coverage. The memory positions to be accessed in order to detect the slow to fall faults cover every Z block and multiplexer. The memory position to be read during the Z decoder must be selected to know which can help to detect the slow to fall faults. All the word bits must be covered. When the Z block contains the data ZERO and ONE the test algorithm can be expressed as follows:

Select the first Z block
Read the memory position which content is 00 . . . 00
Select the following Z block
Read the memory position which content is 111 . . . 1
Repeat the process until all Z blocks are read
Select the last Z block
Read the memory position which content is 000 . . . 0
Select the last-1 Z block
Read the memory position which content is 111 . . . 1

Figure 6:
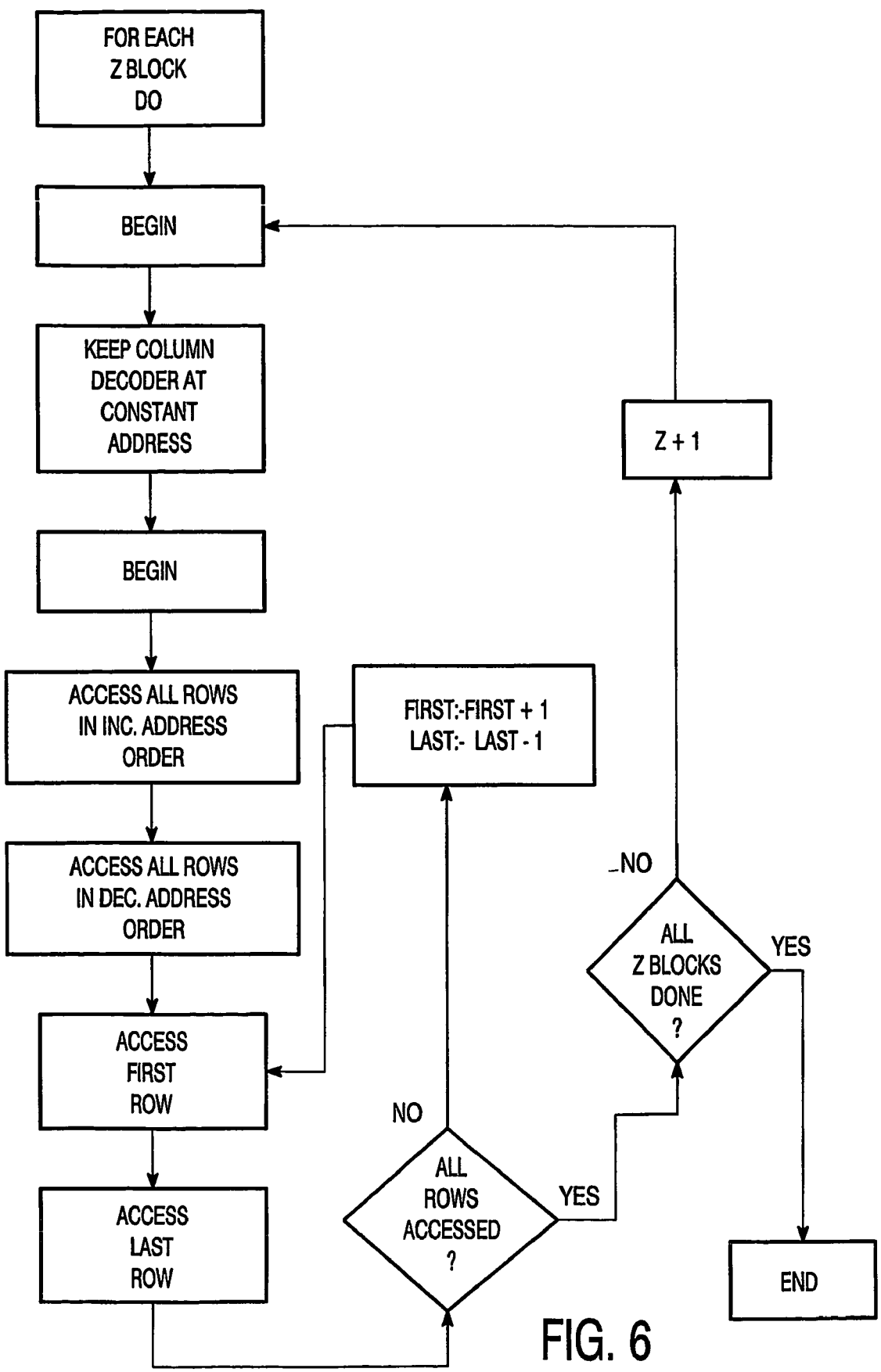
FIG. 6 is a schematic flow diagram illustrating a row decoder test for use in a method according to an exemplary embodiment of the present invention.
Figure 7:
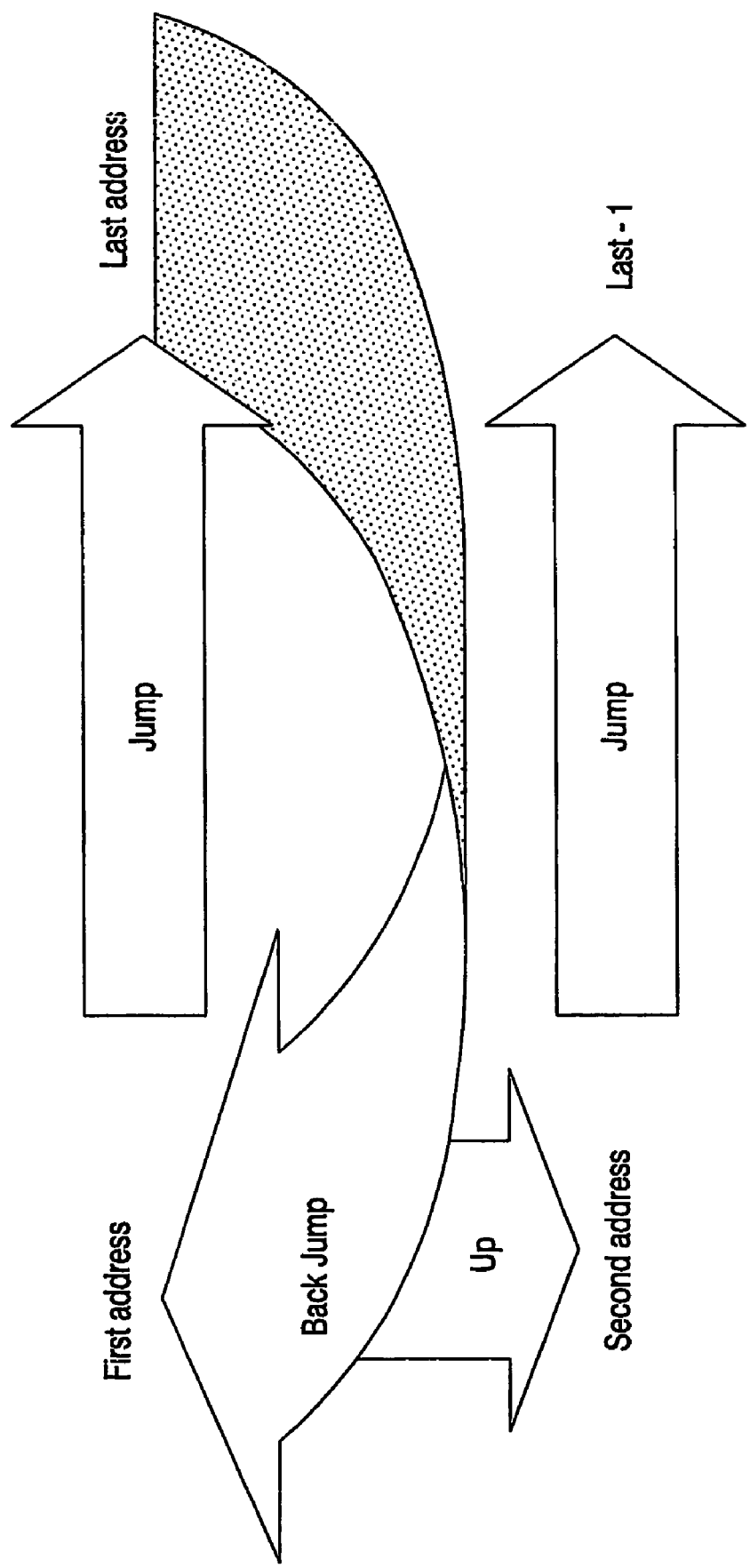
FIG. 7 is a schematic diagram illustrating the jumps needed to cover the resistive open defect leading to a slow-to-rise open defect, according to an exemplary embodiment of the present invention.

The design of the memory may be changed to verify the condition to apply this algorithm. ZERO and ONE can be added to each Z block, however, the same algorithm can be modified to cover the multiplexer delays In summary, an exemplary test algorithm to cover the resistive open defects leading to both the slow-to-fall and slow-to-rise, is introduced:

Test algorithm:

Row Decoder Test (See FIG. 6)

```
For each Z block do /* detection of the slow-to-fall at the row decoder */
    Begin
        Keep the column decoder to constant address;
        Begin
            Access all rows in increasing address order;
            Access all rows in decreasing address order;
```

-continued

```
        End;
        /* detection of the slow-ro-rise at the row decoder */
        Repeat
            Access the first row;
            Access the last row;
            Access the first row;
            First: = first + 1;
            Last: = last − 1;
            Until all rows are accessed:
        End
```

Figure 8:
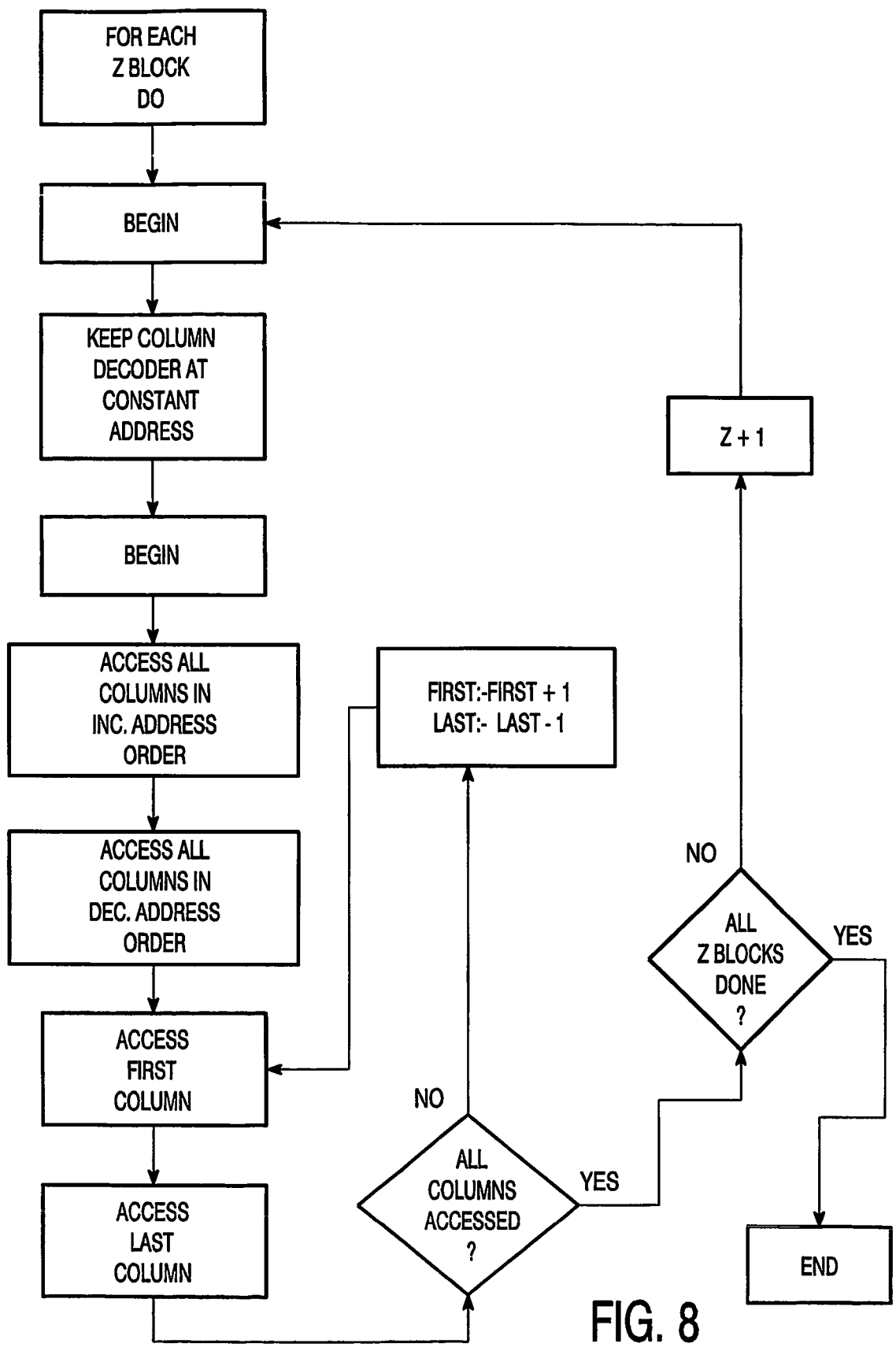
FIG. 8 is a schematic flow diagram illustrating a column decoder test for use in a method according to an exemplary embodiment of the present invention.

Column Decoder Test (See FIG. 8)

```
For each block do /* detection of the slow-to-fall at the column decoder */
    Begin
        Keep the row decoder to constant address;
        Begin
            Access all columns in increasing address order;
            Access all columns in decreasing address order;
        End;
        /* detection of the slow-to-rise at the column decoder */
        Repeat
            Access the first column;
            Access the last column;
            Access the first column;
            First: = first + 1;
            Last: = last −1;
        Until all columns are accessed;
        End;
```

Figure 9:
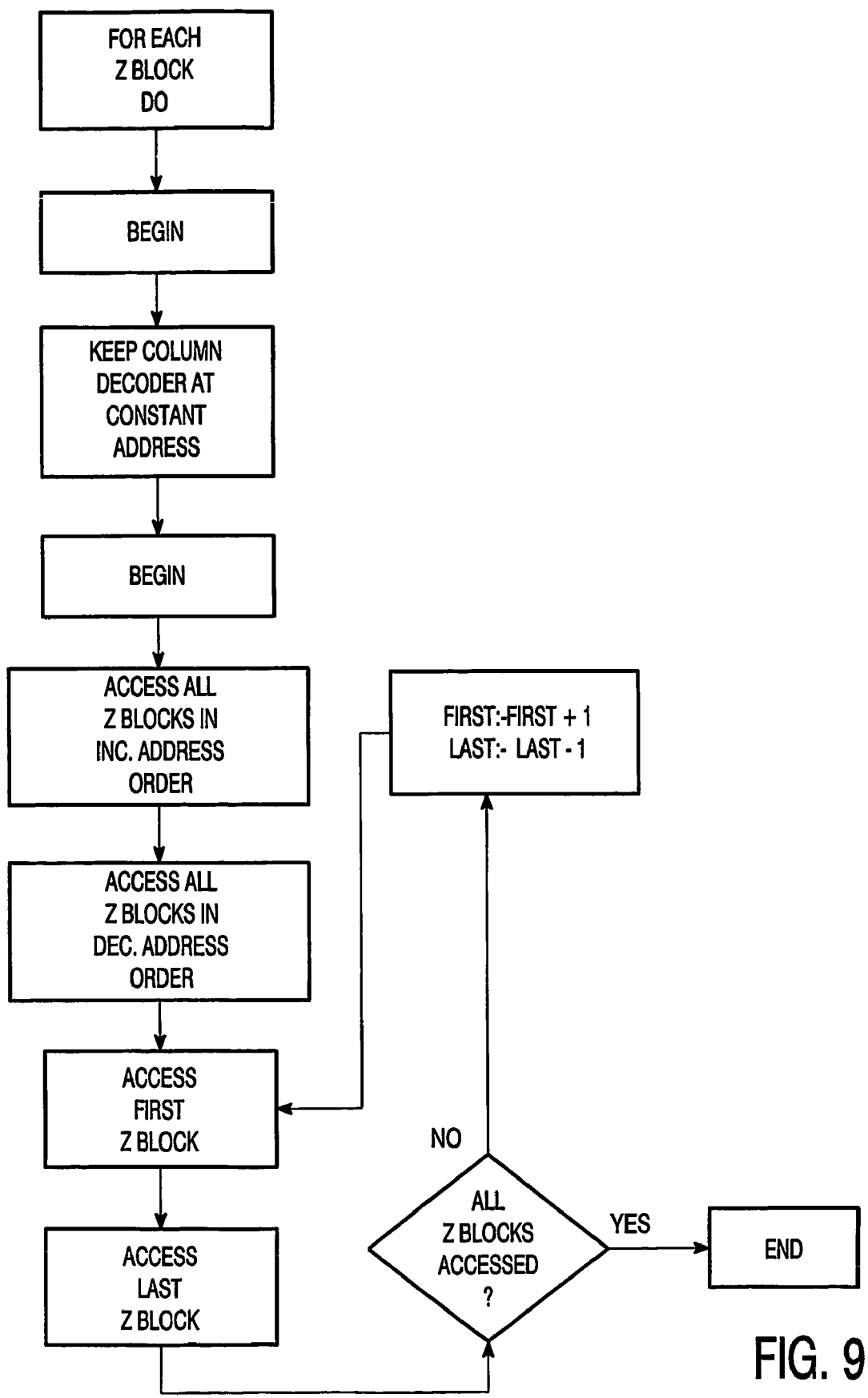
FIG. 9 is a schematic flow diagram illustrating a Z block decoder test for use in a method according to an exemplary embodiment of the present invention.

Z Block Decoder Test (See FIG. 9)

Keep the row and the column decoder at constant address;

```
Begin /* detection of the slow-to-fall at the Z block decoder */
    Access all Z blocks in increasing address order;
    Access all Z blocks in decreasing address order;
End;
Begin /* detection of the slow-to-rise at the Z block decoder */
Repeat
    Access the first Z block;
    Access the last Z block;
    Access the first Z block;
    First = first + 1;
    Last = last − 1;
Until all the Z blocks are accessed;
End.
```

The present invention significantly increases the resistive open fault coverage, because the "very small jumps" and the "very big jumps" are the key idea to sensitize both the resistive open defect leading to slow-to-fall and slow-to-rise behavior. When these conditions are verified, the slow-to-fall behavior leads to simultaneous access of two memory words, the memory outputs behave as the AND or the OR logic of two memory words, while the slow-to-rise gives the wrong logic value 0 or 1 depending on the memory design. The small and big jumps are preferably also applied to the column and Z block decoders, thus the resistive open defects in all memory decoders are covered.

An embodiment of the present invention has been described above by way of example only, and it will be apparent to a person skilled in the art that modifications and variations can be made to the described embodiment without departing from the scope of the present invention as defined by the appended claims. Furthermore, it will be appreciated that the term "comprising" used herein does not exclude other elements or steps, "a" or "an" does not exclude a plurality, and a single processor or other unit may fulfill the functions of several means recited in the claims.

The invention claimed is:

1. A method for testing an electronic circuit that includes a matrix of cells for receiving logic data, said matrix of cells being divided into a plurality of Z blocks each comprising n rows of cells, where n is an integer >1, each Z block is divided into a plurality of U sections, each including some of the n rows of the respective Z block, each U section is divided into a plurality of clusters, each including some of the rows of the respective U section, the method comprising:
   accessing each of said cells in said matrix by consecutively accessing cells in the same Z block until all n rows therein have been accessed,
   accessing each of said cells in said matrix includes consecutively accessing cells in the same U section until all rows therein have been accessed,
   accessing each of said cells in said matrix includes consecutively accessing and testing integrity of cells in the same cluster in a non-linear order until all rows therein have been accessed.

2. The method according to claim 1, wherein
   each cluster is divided into a plurality of sub-clusters, each comprising at least two of the rows of the respective cluster, and
   accessing each of said cells in said matrix includes consecutively accessing and testing integrity of cells in the same sub-cluster until all rows therein have been accessed.

3. The method according to claim 1, wherein accessing each of said cells in said matrix includes performing at least one of read and write operations in respect of each row of cells in said selected block in increasing address order and in decreasing order.

4. The method according to claim 1, wherein accessing each of said cells in said matrix includes accessing the Z blocks are in at least one of increasing address order and decreasing address order.

5. An apparatus for testing an electronic circuit that includes a matrix of cells for receiving logic data, said matrix of cells being divided into a plurality of Z blocks each including n rows of cells, where n is a integer greater than 1, each of said Z blocks being divided into a plurality of U sections, each including some of the n rows of the respective Z block, the apparatus comprising
   a circuit arrangement to access each of said cells in said matrix by consecutively accessing at least two cells in different U sections in the same Z block and testing the integrity of the accessed cells before accessing additional cells in the same Z block until all n rows therein have been accessed.

6. A method for testing an electronic circuit that includes a matrix of cells for receiving logic data, said matrix of cells being divided into a plurality of Z blocks each including n rows of cells, where n is an integer >1, each of said Z blocks being divided into a plurality of U sections, each including some of the n rows of the respective Z block, the method comprising
   accessing each of said cells in said matrix by successively accessing at least two cells in different U sections within the same Z block and testing integrity of the accessed cells before accessing additional cells in the Z block for testing.

7. The method according to claim 6, wherein accessing each of said cells in said matrix includes accessing each Z block in at least one of increasing order and decreasing order.

8. The method according to claim 6, wherein each U section is divided into a plurality of clusters, each comprising some of the rows of cells of the respective U section.

9. The method according to claim 8, wherein each cluster is divided into a plurality of sub-clusters, each comprising at least two of the rows of the respective cluster.

10. The method according to claim 6, wherein accessing each of said cells in said matrix includes
   a) selecting a first Z block, and
   b) accessing each of said rows of cells in said selected Z block in the following logical address order:
      i) the first row;
      ii) the last row;
      iii) the row having a logical address equivalent to said first row plus 1;
      iv) the row having a logical address equivalent to said last row minus 1.

* * * * *